US006966482B2

(12) United States Patent
Totani et al.

(10) Patent No.: US 6,966,482 B2
(45) Date of Patent: Nov. 22, 2005

(54) CONNECTING STRUCTURE OF PRINTED CIRCUIT BOARDS

(75) Inventors: Makoto Totani, Kariya (JP); Toshihiro Miyake, Inuyama (JP); Tomohiro Yokochi, Obu (JP); Takehito Teramae, Chiryu (JP); Yoshitaro Yazaki, Anjo (JP); Kazuyuki Deguchi, Inabe-gun (JP); Hajime Nakagawa, Aichi-gun (JP)

(73) Assignee: Denso Corporation, Kariya (JP)

( * ) Notice: Subject to any disclaimer, the term of this patent is extended or adjusted under 35 U.S.C. 154(b) by 62 days.

(21) Appl. No.: 10/340,798

(22) Filed: Jan. 13, 2003

(65) Prior Publication Data

US 2003/0098339 A1    May 29, 2003

Related U.S. Application Data

(62) Division of application No. 09/907,599, filed on Jul. 19, 2001, now Pat. No. 6,527,162.

(30) Foreign Application Priority Data

Aug. 4, 2000 (JP) .............................. 2000-242784
Dec. 27, 2000 (JP) .............................. 2000-397994

(51) Int. Cl.[7] ........................ H05K 1/03; H01L 23/48; B23K 31/02
(52) U.S. Cl. ...................... 228/215; 174/255; 257/734
(58) Field of Search ........................ 228/175, 180.21, 228/215; 29/830, 831, 840, 843; 174/263, 174/264, 262, 255; 257/734

(56) References Cited

U.S. PATENT DOCUMENTS 4,671,984 A     6/1987  Maeda et al.
4,735,847 A  *  4/1988  Fujiwara et al. ............ 428/209
5,266,746 A    11/1993  Nishihara et al.
5,511,719 A     4/1996  Miyake et al.
5,669,548 A     9/1997  Miyake et al.
5,799,392 A  *  9/1998  Mishiro ........................ 29/830
5,990,553 A    11/1999  Morita et al.
6,089,442 A     7/2000  Ouchi et al.
6,118,183 A     9/2000  Umehara et al.
6,120,301 A     9/2000  Ichitani et al.
6,171,887 B1    1/2001  Yamaji
6,218,630 B1    4/2001  Takigami
6,226,862 B1 *  5/2001  Neuman ...................... 29/830
6,449,836 B1    9/2002  Miyake et al.
6,527,162 B2 *  3/2003  Totani et al. ............... 228/175
2002/0014518 A1  2/2002  Totani et al.
2002/0189862 A1* 12/2002 Miyake et al. ............... 174/262

(Continued)

FOREIGN PATENT DOCUMENTS

EP          0 501 414 A1    9/1992

(Continued)

OTHER PUBLICATIONS

Kenji Numakura, *Introductory High Density Flexible Board*, Nikkan Kogyo Co., Ltd. Dec. 1998, pp. 99-103. (Discussed on p. 1 of the spec.).

(Continued)

*Primary Examiner*—Kiley S. Stoner
(74) *Attorney, Agent, or Firm*—Posz Law Group, PLC

(57) ABSTRACT

Lands formed on a flexible printed circuit board are electrically connected with lands formed on a rigid printed circuit board through solder. At this point, solder resist is formed between neighboring two lands on the rigid printed circuit board, and is terminated with an end portion that is interposed between the rigid printed circuit board and the flexible printed circuit board. Accordingly, even when surplus solder is extruded onto the rigid printed circuit board, the solder resist can prevent solder bridges from being formed between the lands.

10 Claims, 4 Drawing Sheets

U.S. PATENT DOCUMENTS

2003/0079341 A1 * 5/2003 Miyake et al. ................. 29/830
2003/0098339 A1 * 5/2003 Totani et al. ............... 228/175

FOREIGN PATENT DOCUMENTS

| EP | 0535491 | 4/1993 |
| JP | A-9-8453 | 1/1997 |
| JP | A-9-320662 | 12/1997 |
| JP | A-2002-26540 | 1/2002 |

OTHER PUBLICATIONS

"Simultaneous ultrasonic flip chip bonding and underfilling process," Research Research Disclosure, Nov. 2002, p. 1933.

* cited by examiner

PRIOR ART

HEATING HEAD

CONNECTING STRUCTURE OF PRINTED CIRCUIT BOARDS

CROSS REFERENCE TO RELATED APPLICATIONS

The present application is a division of application Ser. No. 09/907,599, filed on Jul. 19, 2001, now U.S. Pat. No. 6,527,162 entitled CONNECTING METHOD AND CONNECTING STRUCTURE OF PRINTED CIRCUIT BOARDS, which is based upon and claims the benefit of Japanese Patent Applications No. 2000-242784 filed on Aug. 4, 2000, No. 2000-397994 filed on Dec. 27, 2000, the contents of which are incorporated herein by reference.

BACKGROUND OF THE INVENTION

1. Field of the Invention

This invention relates to a connecting method and a connecting structure of printed circuit boards.

2. Description of the Related Art

Conventionally, solder is used to connect terminals of a flexible printed circuit board and a rigid printed circuit board. For instance, "Guidance to High Density Flexible Board" (written by Kenji Numakura, printed by Nikkan Kogyo Co. Ltd.) discloses on page 100 a connecting structure of a rigid (hard) printed board and a flexible board due to thermal fusion of solder. According to this structure, as shown in FIG. 1, a land 60a of a rigid printed board 60 is connected with a land 61a of a flexible board 61 by solder 62. The flexible board 61 is adhered to the rigid printed board 60 by adhesive 63.

However, when connection of terminals (lands) of the two boards is achieved by using the solder 62 as shown in FIG. 1, if the amount of solder is excessive, solder bridges are occasionally formed between adjacent two lands. That is, when the lands, which are overlapped with each other after the solder is supplied, is heated and pressurized, the solder is fused to have flowability. At that time, despite very low wettability of an insulating substrate material to solder, if the amount of the solder is excessive, the pressurized solder can flow out from the land to the insulating substrate and to the neighboring land so as to form solder bridges.

SUMMARY OF THE INVENTION

The present invention has been made in view of the above problems. An object of the present invention is to provide connecting method and connecting structure of printed circuit boards, capable of preventing formation of solder bridges.

According to a first aspect of the present invention, in a connecting method and a connecting structure of first and second printed circuit boards respectively having first plurality of lands and second plurality of lands, a solder resist portion is formed on the second printed circuit board between neighboring two lands of the second plurality of lands, and the first and second printed circuit boards are overlapped with each other so that the solder resist portion is terminated to have an end portion that is interposed between the first and second printed circuit boards.

Thus, because the solder resist portion is formed between the neighboring two lands of the second plurality of lands, solder bridges can be prevented from being formed between the lands even when surplus solder is extruded onto the surface of the second printed circuit board when the two boards are pressurized. In the structure in which the end portion of the solder resist portion is interposed between the first and second printed circuit boards, the region where the first and second printed circuit boards are adhered to each other can be provided sufficiently, and the solder resist portion causes no decrease in adhesive strength.

According to a second aspect of the present invention, a protective film is formed on a second conductive pattern of a second printed circuit board, and a first printed circuit board is overlapped with the second printed circuit board to form a gap exposing the second conductive pattern, between an edge face of the first printed circuit board and an edge face of the protective film. The gap works as an escape space into which surplus solder can be extruded from the connecting portion between the first and second printed circuit boards when the connecting portion is pressurized.

According to a third aspect of the invention, when a connecting portion of first and second printed circuit boards is pressurized, a pressurizing member is used to apply larger pressure to a middle portion of a first conductive pattern on the first printed circuit board than that to an end portion of the first conductive pattern. The pressurizing member preferably has an edge portion that is tapered, recessed, or stepped. Therefore, surplus solder moves from the middle portion receiving larger pressure toward the end portion receiving smaller pressure, resulting in decreased amount of extruded solder.

BRIEF DESCRIPTION OF THE DRAWINGS

Other objects and features of the present invention will become more readily apparent from a better understanding of the preferred embodiments described below with reference to the following drawings, in which.

DETAILED DESCRIPTION OF THE PREFERRED EMBODIMENTS (First Embodiment)

A first preferred embodiment of the present invention is described below with reference to appended drawings.

Figure 1:
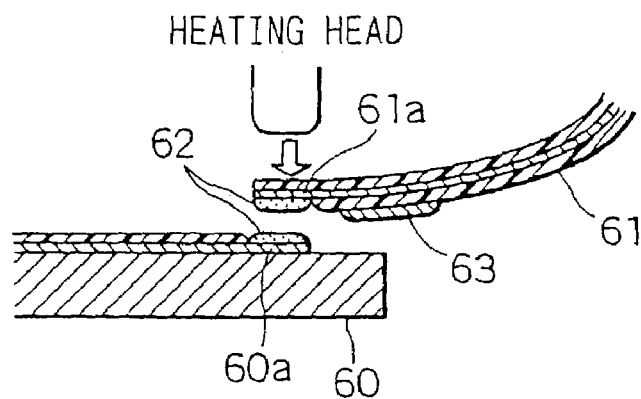
FIG. 1 is a cross-sectional view showing a connecting structure of two boards according to a prior art.
Figure 2:
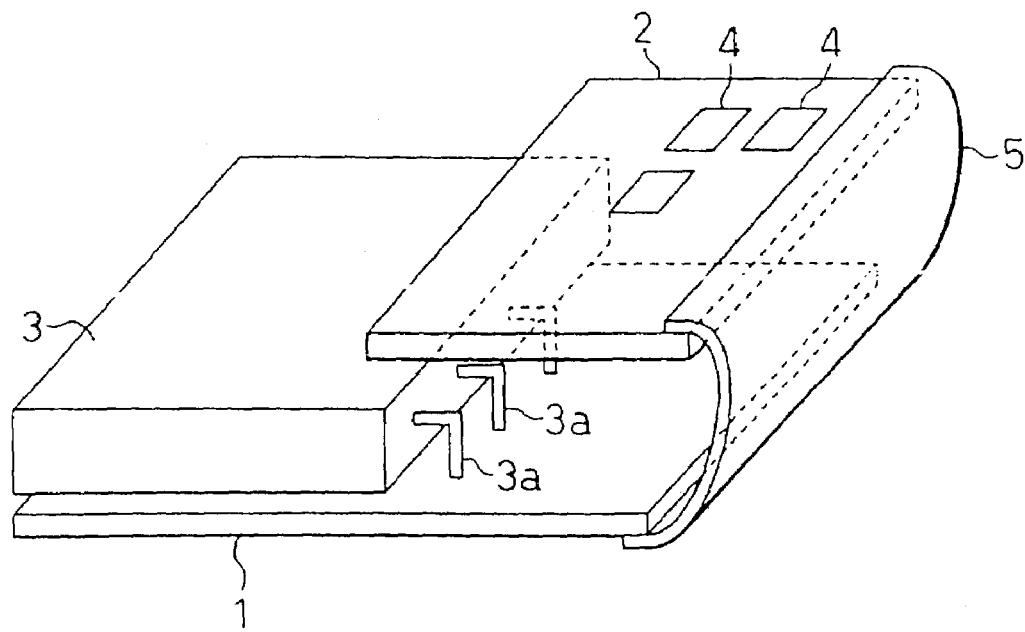
FIG. 2 is a perspective view showing an electronic equipment in a first preferred embodiment.

FIG. 2 shows a part of an electronic equipment in the first embodiment. A rigid printed circuit board 1 and a rigid printed circuit board 2 are supported inside the electronic equipment. Various types of electronic components are mounted on the rigid printed circuit board 1, and FIG. 2 shows a state where an IC 3 of a DIP package is mounted by using pins 3a. Similarly, various types of electronic components 4 are mounted on the rigid printed circuit board 2. Each of the rigid printed circuit boards 1 and 2 is constructed of an insulating substrate 10 made of, for instance, glass cloth-based epoxy resin.

A flexible printed circuit board 5 is electrically connected with the edge portions of the rigid printed circuit board 1 and the rigid printed circuit board 2 that are placed horizontally on the upper and the lower sides. An insulating substrate 12 of the flexible printed circuit board 5 is made of thermoplastic resin (@PEEK) containing 65 to 35% by weight of polyether ether ketone (PEEK) and 35 to 65% by weight of polyether imide (PEI). @PEEK is thermoplastic resin that softens at a temperature not lower than the glass transition temperature.

Figure 3:
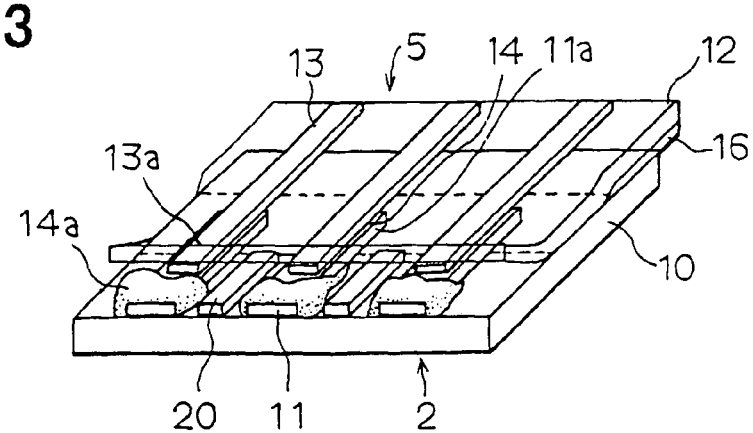
FIG. 3 is a perspective view showing a connecting portion of two boards in the first embodiment.

FIG. 3 shows an enlarged view of the portion where the rigid printed circuit board 2 is connected with the flexible printed circuit board 5. In FIG. 3, it should be noted that the insulating substrate 12 and a solder resist film 16 are illustrated as being transparent for making the connecting structure understood easier for convenience.

Several conductive patterns 11 are formed on the upper surface of the rigid printed circuit board 2, and are respectively terminated at positions located at a predetermined distance from the edge portion of the rigid printed circuit board 2. Further, lands 11a are respectively formed on the end portions of the conductive patterns 11. Solder 14 is supplied onto the lands 11a as a connection material.

Likewise, several conductive patterns 13 are formed on the surface of the flexible printed circuit board 5 in correspondence to the conductive patterns 11 provided on the rigid printed circuit board 2, and lands 13a are respectively formed as connection terminals on the end portions of the conductive patterns 13. The conductive patterns 11 and 13 are made of copper. The conductive patterns 13 include several wiring members extending in a longitudinal direction of the flexible printed circuit board 5, and are covered with solder resist 16 as a protective film except for the lands 13a.

At the connecting portion of the rigid printed circuit board 2 and the flexible printed circuit board 5, the lands 11a of the conductive patterns 11 are respectively connected with the lands 13a of the conductive patterns 13 by the solder 14. The glass epoxy resin (insulating substrate) 10 constituting the rigid printed circuit board 2 is adhered to the @PEEK (insulating substrate) 12 constituting the flexible printed circuit board 5 by the @PEEK 12 deformed at the portions exposed between the conductive patterns 11 and 13.

On the rigid printed circuit board 2, solder resist 20 is disposed between adjacent two conductive patterns 11 (including the lands 11a). The solder resist 20 provides a specific gap (30 μm or more) with each of the conductive patterns 11, and extends along the conductive patterns 11. An end portion 17 of the solder resist 20 intrudes into (is interposed between) the adhering surfaces of the rigid printed circuit board 2 and the flexible printed circuit board 5.

Next, the method for connecting the flexible printed circuit board 5 as a first printed circuit board and the rigid printed circuit board 2 as a second printed circuit board is explained below with reference to FIGS. 4 and 5.

First, the conductive patterns 11 are formed on the insulating substrate 10 of the rigid printed circuit board 2. At this point, the conductive patterns 11 are not formed on the front edge portion of the rigid printed circuit board 2, so that the glass epoxy resin 10 is exposed at the front edge portion of the rigid printed circuit board 2. Then, the solder resist 20 is formed to cover the conductive patterns 11 on the rigid printed circuit board 2. The region where the solder resist 20 is formed is shown in FIG. 5. As shown in FIG. 5, the solder resist 20 is formed to cover almost the entire surface of the insulating substrate 10 having the conductive patterns 11, apart from the edge of the insulating substrate 12 of the flexible printed circuit board 5. Further, the solder resist 20 has several protruding portions each of which extends between adjacent two conductive patterns 11 to have an end portion 17 intervening between the adhering surfaces of the two insulating substrates 10, 12 when the two boards 2, 5 are overlapped with each other.

Next, solder paste is applied to the lands 11a of the conductive patterns 11 as the solder 14 thereon. In this instance, the solder 14 may be formed on the lands 11a by solder plating or solder coating. In the present case, tin-lead eutectic solder is used as the solder 14, which has a melting point (fusing temperature) of 183° C.

A flux or a hydrocarbon compound such as alkane is applied to or mixed with the solder 14 to secure wettability of the solder 14. Particularly, in case of coating a hydrocarbon compound such as alkane, it is preferred that not only the solder 14, but also the entire overlapping surfaces of the both substrates are coated therewith. In this case, while interposing alkane between the rigid printed circuit board 2 and the flexible printed circuit board 5, they are heated to a temperature not lower than the boiling point of alkane. Thus, alkane intrudes into the surface of the @PEEK 12, and as a result, a layer containing alkane dispersed therein is formed on the surface of the @PEEK 12. The dispersion layer thus formed exhibits a modulus of elasticity lower than the initial modulus of elasticity possessed by the @PEEK 12. That is, the adhesiveness of the @PEEK 12 (to the insulating substrate 10) can be improved by forming the dispersion layer on the surface of the @PEEK 12.

Then, the conductive patterns 13 are formed on the flexible printed circuit board 5 in such a manner that they correspond to the conductive patterns 11 of the rigid printed circuit board 2. Subsequently, the solder resist 16 is formed on the flexible printed circuit board 5 except the lands 13a of the conductive patterns 13 and the portions between the lands 13. The flexible printed circuit board 5 thus formed is aligned and overlapped with the rigid printed circuit board 2. At this point, the two boards 2, 5 are aligned so that a specific distance is defined between the edge of the flexible printed circuit board 5 and the solder resist 20 excluding the protruding portions thereof and so that the end portions 17 of the protruding portions reach the connecting portion of the two boards 2, 5.

Figure 4:
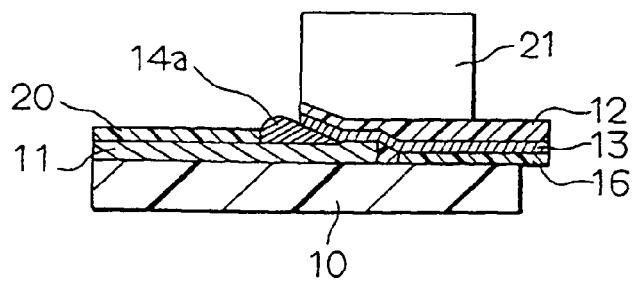
FIG. 4 is a cross-sectional view for explaining a method for connecting the two boards in the first embodiment.
Figure 5:
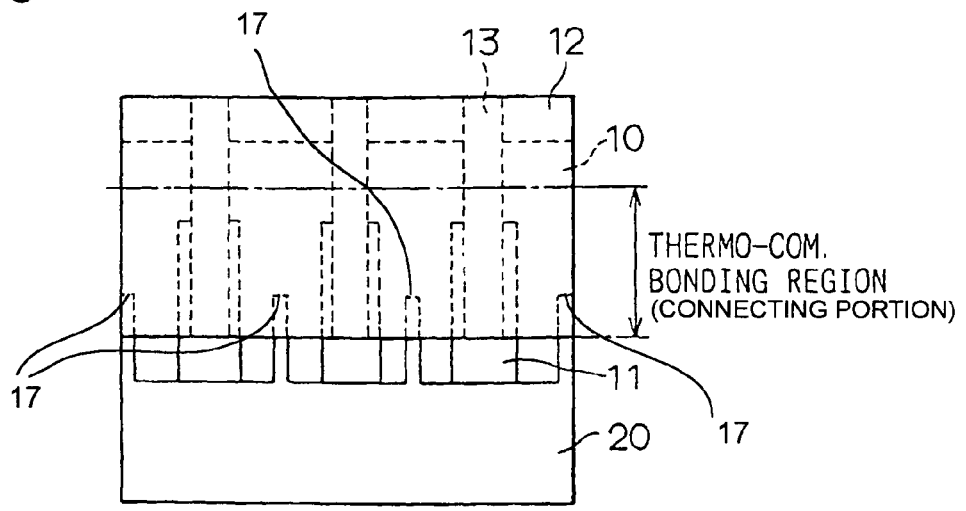
FIG. 5 is a plan view schematically showing a bonding region in the first embodiment.

Next, referring to FIG. 4, the connecting portion, at which the rigid printed circuit board 2 and the flexible printed circuit board 5 are overlapped with each other, is heated while applying pressure by a thermo-compression bonding tool (pressurizing member) 21. The glass transition temperature of the @PEEK 12 is in a range of 150 to 230° C., and the thermo-compression bonding tool 21 applies pressure to the connecting portion while controlling the temperature to fall in a range not lower than the fusing temperature of the solder 14 and not lower than the glass transition temperature of the @PEEK 12. For instance, the heat temperature is in a range of 240 to 400° C., and the heating and pressurization is continued for 5 to 15 sec. The thermo-compression bonding tool 21 is a pulse heating type in the present case.

The thermo-compression bonding tool 21 is explained in more detail below.

As shown in FIG. 4, the thermo-compression bonding tool 21 is formed to have an edge portion that is tapered and is placed at the front edge side of the flexible printed circuit board 5. Therefore, when the thermo-compression bonding tool 21 pressurizes the flexible printed circuit board 5, large pressure is applied to portions corresponding to the middle portions of the conductive patterns 13 (lands 13a), formed on the flexible printed circuit board 5, as compared to the end portions of the conductive patterns 13.

Because of this, solder fuses and moves from a side of the middle portions of the conductive patterns 13 receiving larger pressure, toward a side of the end portions thereof receiving smaller pressure. Specifically, in the portion corresponding to the end portions of the conductive patterns 13, the pressure applied to the flexible printed circuit board 5 is small, and the edge portion of the board 5 is deformed along the shape of the thermo-compression bonding tool 21. In consequence, solder fillets 14a are formed on the end portions of the conductive patterns 13, thereby reducing the amount of solder extruded onto the insulating substrate 10 of the rigid printed circuit board 2.

While connecting the lands 11a, 13a of the conductive patterns 11, 13 by fused solder 14 under heating and pressurization by the thermo-compression bonding tool 21, the @PEEK 12 constituting the insulating substrate of the flexible printed circuit board 5 is softened and deformed to closely adhere to the connecting surface of the rigid printed circuit board 2. The thermo-compression bonding region bonded by the thermo-compression bonding tool 21 is shown in FIG. 5, where deformed @PEEK 12 adheres to the rigid printed circuit board 2 at portions exposed between the conductive patterns 11.

In this point, in the present embodiment, the protruding portions of the solder resist 20, which is disposed on the rigid printed circuit board 2, extend among the conductive patterns 11 with the end portions 17 intervening between the adhering (bonding) surfaces of the two printed circuit boards 2, 5. Accordingly, even if the amount of the solder 14 supplied between the lands 11a, 13a of the printed circuit boards 2, 5 is excessive so that the solder 14 extrudes onto the insulating substrate 10 of the rigid printed circuit board 2, the protruding portions of the solder resist 20 securely prevent bridges from being formed between neighboring lands 11a.

In addition, the protruding portions of the solder resist 20 are terminated so that the end portions 17 thereof intervene between the adhering surfaces of the two printed circuit boards 2, 5. Because of this, the two printed circuit boards 2, 5 can adhere to each other with a sufficient area and a sufficient strength.

Here, the effect of the solder resist 20 with respect to the adhesive strength between the two printed circuit boards 2, 5 is explained below. The solder resist 20 is constructed by, for instance, denatured epoxy resin used as a principal component to which filler, organic solvent, setting agent, antifoaming agent, etc., are added. The antifoaming agent contained in the solder resist 20 significantly weakens the adhesive strength with respect to the @PEEK constituting the flexible printed circuit board 5 as a substrate material. Therefore, if the solder resist 20 having the above-described composition intervenes, along the conductive patterns 11, between the two printed circuit boards 2, 5 at the entire area of the thermo-compression bonding region, a sufficient adhesive strength can not be attained when the two printed circuit boards 2, 5 are adhered to each other by softened and deformed @PEEK.

In the present embodiment, because the solder resist 20 is formed in such a manner that only the end portions 17 of the protruding portions thereof intervenes between the adhering surfaces of the printed circuit boards 2, 5, the area of the solder resist 20 interposed between the two printed circuit boards 2, 5 can be reduced as small as possible. It is most preferred that the end portions 17 of the protruding portions of the solder resist 20 contact the edge face of the flexible printed circuit board 5 not to intervene between the adhering surfaces of the printed circuit boards 2, 5. Even in this case, the solder resist 20 can prevent the formation of bridges when the solder 14 extrudes onto the insulating substrate 10, provided that the end portions 17 contact the edge face of the flexible printed circuit board 5.

However, in the above-described structure, even slight positional slippage between the two boards 2, 5 generated in formation of the solder resist 20 or in alignment of the boards 2, 5 can produce a gap between the end portions 17 of the protruding portions of the solder resist 20 and the edge face of the flexible printed circuit board 5. Therefore, in the present embodiment, the end portions 17 of the solder resist 20 are disposed between the adhering surfaces of the two boards 2, 5 so that no gap is produced between the solder resist 20 and the flexible printed circuit board 5 even when a certain positional slippage arises.

Also, in the present embodiment, the protruding portions of the solder resist 20 are respectively disposed defining specific gaps from the conductive patterns 11, on the rigid printed circuit board 2. When the solder 14 is fused to move on the conductive patterns 11, the solder 14 spreads wider than the conductive patterns 11 because pressure is applied to the flexible printed circuit board 5. In this case, if there is no gap between the solder resist 20 and the conductive patterns 11, there arises a case where solder receives resistance from the end portions of the solder resist 20 and extrudes in the vicinity of the end portions to form bridges. Therefore, a specific gap (more than 30 $\mu$m) should be provided between each end portion of the solder resist 20 and each conductive pattern 11 to prevent such phenomenon.

Although the preferred embodiment of the present invention is explained as above, the present invention is not limited to the above-described embodiment but will be changed in various manners.

For instance, in the above-described embodiment, the rigid printed circuit board 2 and the flexible printed circuit board 5 are adhered to each other by utilizing the thermoplastic property of the substrate material for the flexible printed circuit board 5, while performing the connection of the lands by the solder. However, in the connection between the first printed circuit board and the second printed circuit board, both the printed circuit boards may be flexible printed circuit boards respectively made of thermoplastic resin. In the case of utilizing the rigid printed circuit board, a ceramic substrate or a metal base substrate may be used as an insulating substrate thereof in place of the resin substrate.

Also, in addition to @PEEK, polyether imide (PEI) or polyether ether ketone (PEEK) may be used alone as an insulating resin material for the flexible printed circuit board. Further, other thermoplastic resins such as polyethylene naphthalate (PEN), polyethylene terephthalate (PET), and liquid crystal polymer may be used as an insulating material for the flexible printed circuit board. Otherwise, an insulating substrate of the flexible printed circuit board may be composed of a polyimide substrate laminated with a layer made of a thermoplastic resin material containing at least one of PEEK, PEI, PEN, and PET. The layer made of the thermoplastic resin material can be adhered to the polyimide substrate by adhesive or the like. Because the polyimide substrate has a thermal expansion coefficient of about 15 to 20 ppm close to that (17 to 20 ppm) of copper that is frequently used as wiring members, peeling off (separation), warping and the like of the flexible printed circuit board can be prevented.

In addition, in the above-described example, the solder 14 is supplied onto the lands 11a of the conductive patterns 11 on the rigid printed circuit board 2; however, it may be supplied onto the lands 13a of the conductive patterns 13 on the flexible printed circuit board 5. Otherwise, the solder 14 may be provided on both the lands 11a and 13a.

The shape of the lands 11a and 13a may be either square or round, or the lands 11a and 13a may have different shapes from one another. Especially from the view of preventing formation of solder bridges, each conductive pattern (land) is preferably tapered, i.e., deceased in width from the middle portion where thermo-compression bonding is performed toward the end portion thereof.

Accordingly, a sufficient distance between neighboring two conductive patterns can be secured easily at the edge portion of the thermo-compression bonding region where solder bridges are liable to be formed. In this case, the shape of the solder resist disposed in the neighboring conductive patterns may be rectangular or be increased in width from the thermo-compression bonding region toward the end portions of the conductive patterns in correspondence to the shape of the conductive patterns.

Further, in place of the solder resist 16 for the flexible printed circuit board 5, a cover layer made of thermoplastic resin as described above may cover the conductive patterns 13. Solder resist containing denatured epoxy resin as a principal component cannot exhibit a sufficient adhesive strength with respect to epoxy resin as a substrate material constituting the rigid printed circuit board or solder resist having the same composition and formed on the substrate. As opposed to this, when the conductive patterns 13 on the flexible printed circuit board 5 are covered with the cover layer made of the above-described thermoplastic resin (@PEEK, PEEK, PEI, PEN, PET), the cover layer firmly adheres to the epoxy resin constituting the rigid printed circuit board, whereby the adhesive strength between the two boards can be enhanced largely.

The solder resist 20 formed on the conductive patterns 11 of the rigid printed circuit board 2 may be replaced with the cover layer made of the thermoplastic resin as described above. In this case, because the adhesiveness with respect to the substrate material of the flexible printed circuit board 5 is enough, the length of each protruding portion of the cover layer disposed between neighboring two conductive patterns 11 may be changed appropriately in a range of a length substantially equal to that of the conductive patterns 11 to a length with which the end portion thereof can intervene between the adhering surfaces of the two printed circuit boards 2, 5.

Meanwhile, it is not always necessary to provide the solder resist or the cover layer covering the conductive patterns 11, 13 on the respective printed circuit boards 2, 5. In this case, the solder resist or the thermoplastic resin should be disposed only between the respective neighboring conductive patterns 11 on the rigid printed circuit board 2, as solder resist preventive portions.

(Second Embodiment)

A second preferred embodiment of the present invention is explained with reference to FIGS. 6A, 6B, and 7, in which the same or similar parts as those in the first embodiment are designated with the same reference numerals.

Figure 7:
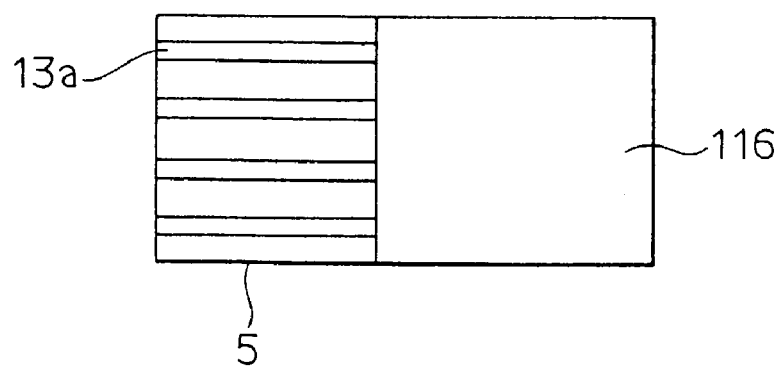
FIG. 7 is a plan view schematically showing a flexible printed circuit board in the second embodiment.

In the second embodiment, the conductive patterns (Cu patterns) 13 on the flexible printed circuit board 5 are covered with a protective film 116 except for the lands 13a as shown in FIG. 7. The protective film 116 is made of the same material (thermoplastic resin) as that constituting the flexible printed circuit board 5. The conductive patterns (Cu patterns) 11 on the rigid printed circuit board 2 are covered with solder resist 120 except for the lands 11a.

Further, a solder plating 7 is formed on the lands 13a of the conductive patterns 13 on the flexible printed circuit board 5, and a solder leveler 8 is formed on the lands 11a of the conductive patterns 11 on the rigid printed circuit board 2. The lands 11a and the lands 13a electrically communicate with one another through the solder plating 7 and the solder leveler 8. Solder (tin-lead eutectic solder having a fusing temperature of 183° C.) maybe formed on at least one side of the lands 11a and the lands 13a. The other structural features are substantially the same as those in the first embodiment.

Next, the connecting method between the flexible printed circuit board 5 and the rigid printed circuit board 2 is explained. First, the conductive patterns 11 are formed on the rigid printed circuit board 2 except a connecting surface front edge portion of the rigid printed circuit board 2. Accordingly, glass epoxy resin is exposed on the front edge portion of the rigid printed circuit board 2. After that, the solder resist 120 is formed on the rigid printed circuit board 2 except not only the front edge portion where the conductive patterns 11 are not formed but also the lands 11a of the conductive patterns 11 and portions exposed between the lands 11a, thereby covering the conductive patterns 11 with the solder resist 120. Further, the solder leveler 8 is formed on the lands 11a of the conductive patterns 11.

On the other hand, the conductive patterns 13 are formed on the flexible printed circuit board 5 to correspond to the conductive patterns 11 on the rigid printed circuit board 2. The protective film 116 made of @PEEK is formed on the conductive patterns 13 except the lands 13a and the portions exposed between the lands 13a. After that, the solder plating 7 is formed on the lands 13a.

A flux or a hydrocarbon compound such as alkane is applied to at least one of the solder plating 7 and the solder leveler 8 so as to secure wettability thereof. Especially in case of applying a hydrocarbon compound such as alkane, the hydrocarbon compound is preferably applied not only to the solder plating 7 or the solder leveler 8 but also to the entire area of the overlapping surfaces of the two boards 2, 5.

In this case, as described in the first embodiment, while interposing alkane between the rigid printed circuit board 2 and the flexible printed circuit board 5, they are heated to a temperature not lower than the boiling point of alkane. Thus, alkane intrudes into the surface of @PEEK forming the flexible printed circuit board 5, and as a result, a layer containing alkane dispersed therein is formed on the surface of the @PEEK. The dispersion layer thus formed exhibits a modulus of elasticity lower than the initial modulus of elasticity possessed by the @PEEK. That is, the adhesiveness of the @PEEK to an adhered layer (glass cloth-based epoxy resin) can be improved by forming the dispersion layer on the surface of the @PEEK.

The flexible printed circuit board 5 thus formed is aligned and overlapped with the rigid printed circuit board 2. At this point, the two boards 2, 5 are aligned so that a specific gap is defined between the edge face of the flexible printed circuit board 5 and the edge face of the solder resist 120. As a result, a part of the conductive patterns 11 on the rigid printed circuit board 2 is exposed from the gap.

Figure 6A:
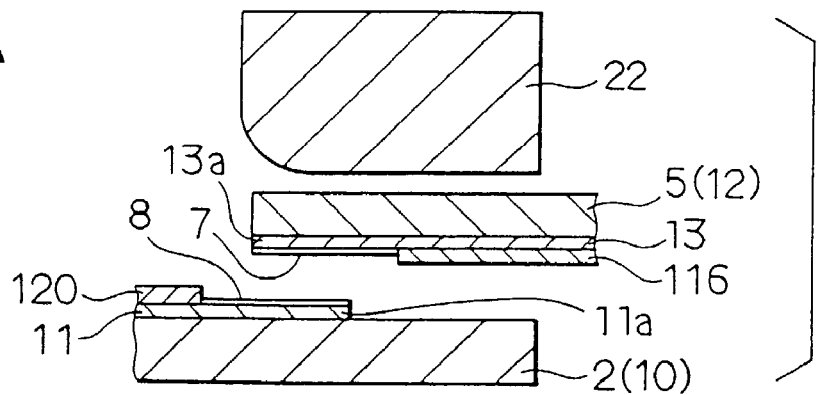
FIGS. 6A and 6B are cross-sectional views showing a connecting structure in a second preferred embodiment.
Figure 6B:
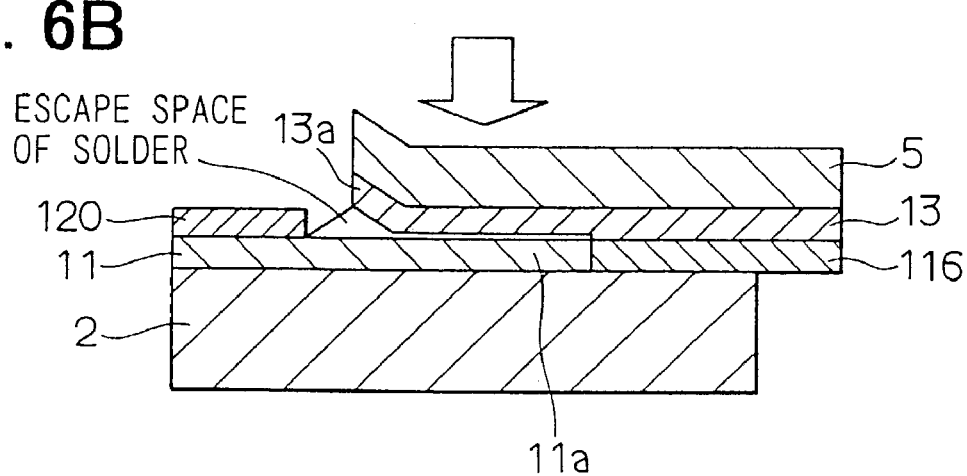

Next, referring to FIGS. 6A and 6B, the connecting portion, where the rigid printed circuit board 2 and the flexible printed circuit board 5 are overlapped with each other, is heated while applying pressure by a thermo-compression bonding tool 22. The glass transition temperature of @PEEK 12 forming the flexible printed circuit board 5 and the protective film 116 is in a range of 150 to 230° C., and the thermo-compression bonding tool 22 applies pressure to the connecting portion while controlling the temperature to fall in a range not lower than the fusing temperature of the solder 7 and not lower than the glass transition temperature of @PEEK. For instance, the heat temperature is in a range of 240 to 400° C., and the heating and pressurization is continued for 5 to 15 sec. The thermo-compression bonding tool 22 is a pulse heating type in the present case.

The thermo-compression bonding tool 22 is explained in more detail below.

Referring to FIG. 6A, similarly to the first embodiment, the thermo-compression bonding tool 22 is formed to have an edge portion that is tapered (rounded) and is placed at the front edge side of the flexible printed circuit board 5. Therefore, when the thermo-compression bonding tool 22 pressurizes the flexible printed circuit board 5, large pressure is applied to a portion corresponding to the middle portions of the conductive patterns 13 (lands 13a), formed on the flexible printed circuit board 5, as compared to the portion corresponding to the end portions of the conductive patterns 13.

Because of this, solder fuses and moves from a side of the middle portions of the conductive patterns 13 receiving larger pressure toward a side of the end portions thereof receiving smaller pressure. In the portion corresponding to the end portions of the conductive patterns 13, the pressure applied to the flexible printed circuit board 5 is small, and the edge portion of the board 5 is deformed along the shape of the thermo-compression bonding tool 22. In consequence, an amount of solder extruded from the conductive patterns 13 onto the insulating substrate 10 of the rigid printed circuit board 2 can be reduced, thereby suppressing formation of solder bridges from being produced between neighboring conductive patterns.

While connecting the lands 11a, 13a of the conductive patterns 11, 13 by fusing the solder 7 and the solder leveler 8 due to thermal compression by the thermo-compression bonding tool 22, @PEEK 12 constituting the insulating substrate of the flexible printed circuit board 5 and the protective film 116 thereof is softened and deformed to closely adhere to the connecting surface of the rigid printed circuit board 2.

In the present embodiment, because @PEEK is used for the protective film 116, the protective film 116 firmly adheres to the front edge portion of the rigid printed circuit board 2. Thus, the insulating property at the front edge side of the rigid printed circuit board 2 can be attained and simultaneously the adhesive strength between the two boards can be enhanced. That is, because the protective film 116 and the portion of the flexible printed circuit board 5 that is deformed to intrude among the lands 11a can closely adhere to the rigid printed circuit board 2, the adhering area between the two boards is increased to increase the adhesive strength between them.

Also in the present embodiment, because the two boards 2, 5 are aligned to define a predetermined gap between the edge face of the flexible printed circuit board 5 and the edge face of the solder resist 120, the gap can be utilized as a space (escape space) into which surplus solder escapes when the amount of solder on the lands 11a, 13a is excessive. This gap can prevent formation of solder bridge, in cooperation with the point that the thermo-compression bonding tool 22 applies lower pressure to the edge portion of the flexible printed circuit board 5.

In addition, whether both the lands are connected with each other through solder or not can be checked by appearance of the shape of solder fillet that is formed in this gap by thermo-compression. The reason is explained below.

In order to electrically connect the two boards 2, 5, after solder is applied to one or both of the lands 11a, 13a, the lands 11a, 13a are superposed to each other, and are heated and pressurized by the thermo-compression bonding tool 22 so that the solder is fused. At this point, if solder applied to one of the lands adheres to (wets) the other one of the lands or solder on the other one of the lands, the connection through the solder is effectively achieved.

However, there is a case where solder applied to one of the lands does not adhere to (wet) the other one of the lands or solder on the other one of the lands due to an oxide film formed on the surface thereof. In this case, solder flows toward the gap as described above due to the pressurization of the thermo-compression bonding tool 22. Then, because the solder does not wet the other land or the solder on the other land, the solder keeps separating from it in the gap. Thus, whether the connection through solder can be achieved effectively or not can be checked by the shape of the solder fillet formed in the gap. Specifically, if the solder fillet formed in the gap contacts both the upper and lower lands 11a, 13a without separating from them, it is decided that the connection is good (effective). On the other hand, if the solder fillet separates from the other land or solder on the other land, it is decided that the connection is failure (ineffective).

After that, the gap in which the solder fillet is formed is sealed with insulating resin or the like. Accordingly, an insulating property of the electric connecting portion between the two boards can be secured. When the insulating property of the electric connecting portion is not required (such as a case where it is accommodated in a housing having insulating property), this sealing step needs not be performed.

(Third Embodiment)

Next, a third preferred embodiment of the present invention is explained with reference to FIGS. 8A and 8B, mainly in points different from the second embodiment. The same points as in the second embodiment are not reiterated.

Figure 8A:
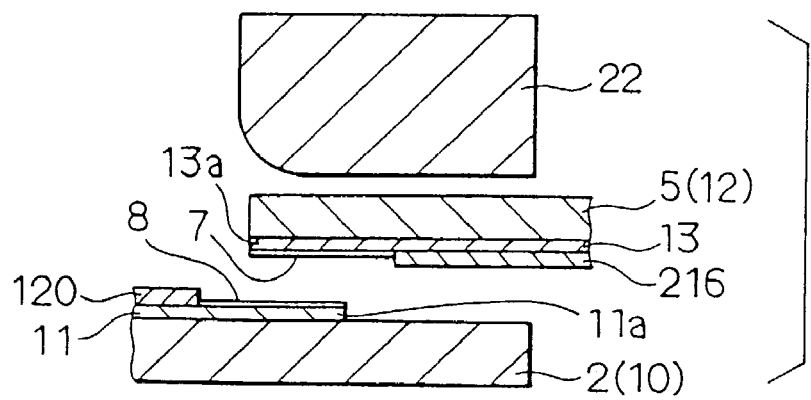
FIGS. 8A and 8B are cross-sectional views showing a connecting structure in a third preferred embodiment.
Figure 8B:
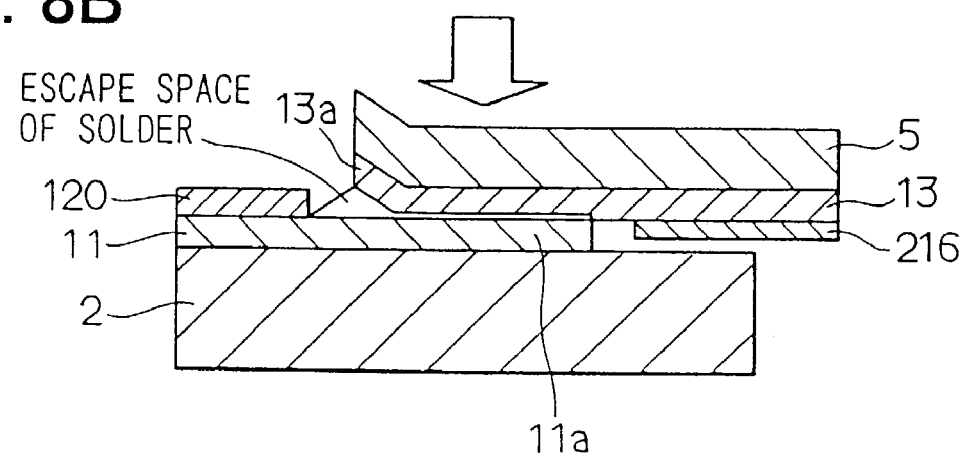

Specifically, the third embodiment differs from the second embodiment in a points that, as shown in FIGS. 8A and 8B, a protective film 216 for the flexible printed circuit board 5 is made of not @PEEK but solder resist. The two boards 2, 5 are aligned so that a specific gap is provided between the edge face of the solder resist 120 and the edge face of the conductive patterns 13 and so that another specific gap is provided between the edge face of the solder resist 216 formed on the conductive patterns 13 and the edge face of the conductive patterns 11 formed on the rigid printed circuit board 2. Then, the two boards 2, 5 are connected to each other by the thermo-compression bonding tool 22.

Accordingly, two escape spaces for surplus solder are provided by the gap between the solder resist 120 and the conductive patterns 13 and the gap between the solder resist 216 and the conductive patterns 11. As a result, short-circuit between neighboring wiring members caused by surplus solder can be prevented more securely.

The solder resist 216 is formed from, for instance, denatured epoxy resin as a principal component, and additives such as filter, organic solvent, setting agent, and the like.

When adhering the solder resist 216 to the rigid printed circuit board 2 made of glass epoxy resin by heating and pressurization after the solder resist 216 is formed on the flexible printed circuit board 5, the adhesive strength is insufficient as compared to that in the second embodiment because both materials have thermosetting properties. However, the solder resist 216 can be used as a protective film for the conductive patterns 13 on the flexible printed circuit board 5 at least in case where excessive stress is not applied to the connecting portion between the two boards 2, 5.

In the above-described embodiments, the thermo-compression bonding tool is tapered at the edge portion thereof so that it can apply larger pressure to the portion corresponding to the middle portions of the conductive patterns; however, the thermo-compression bonding tool may have a stepped portion or a recess portion in place of the tapered portion to exhibit the above effect. In the third embodiment, two gaps are provided between the solder resist 120 and the conductive patterns 13 and between the solder resist 216 and the conductive patterns 11 as escape spaces for surplus solder. The two spaces for surplus solder may be provided in the second embodiment as well.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A connecting structure of printed circuit boards, comprising:
   a first printed circuit board made of a thermoplastic resin and having a first conductive pattern with a first plurality of lands thereon;
   a second printed circuit board having a second conductive pattern with a second plurality of lands thereon and overlapped with the first printed circuit board at a connecting portion;
   a solder interposed between the first plurality of lands and the second plurality of lands and electrically connecting the first plurality of lands and the second plurality of lands; and
   a solder resist portion disposed on the second printed circuit board between neighboring two lands of the second plurality of lands, extending to the connecting portion, and being terminated with an end portion that is interposed between the first printed circuit board and the second printed circuit board, wherein the solder resist portion is spaced from the neighboring two lands.

2. The connecting structure of claim 1, wherein a gap between the solder resist portion and each of the neighboring two lands is 30 μm at least.

3. A connecting structure of printed circuit boards, comprising:
   a first printed circuit board made of a thermoplastic resin and having a first conductive pattern with a first plurality of lands thereon;
   a second printed circuit board having a second conductive pattern with a second plurality of lands thereon and overlapped with the first printed circuit board at a connecting portion;
   a solder interposed between the first plurality of lands and the second plurality of lands and electrically connecting the first plurality of lands and the second plurality of lands; and
   a solder resist portion disposed on the second printed circuit board between neighboring two lands of the second plurality of lands, extending to the connecting portion, and being terminated with an end portion that is interposed between the first printed circuit board and the second printed circuit board, wherein the solder resist portion is a protrusion that extends parallel to the lands of the second plurality of lands.

4. A printed circuit board structure comprising:
   a first printed circuit board, which is made of a thermoplastic resin, wherein the first printed circuit board includes a first conductive pattern, and the first conductive pattern includes a first plurality of lands;
   a second printed circuit board, wherein the second printed circuit board includes a second conductive pattern, which includes a second plurality of lands, and wherein the second printed circuit board overlaps with and is adhered to the first printed circuit board at a connecting portion;
   solder located between the first plurality of lands and the second plurality of lands, wherein the solder electrically connects the first plurality of lands to the second plurality of lands, respectively; and
   a solder resist portion located on the second printed circuit board between two adjacent lands of the second plurality of lands, wherein the solder resist portion is a protrusion that extends into the connecting portion such that a terminal end portion of the protrusion is located between the first printed circuit board and the second printed circuit board.

5. The structure of claim 4, wherein the solder resist portion is spaced from each of the two adjacent lands.

6. The structure of claim 5, wherein a gap exists between the solder resist portion and each of the two adjacent lands, and the size of the gap is at least 30 μm.

7. The structure of claim 4, wherein a substrate surface of the first printed circuit board is adhered to a substrate surface of the second printed circuit board at the connecting portion.

8. The structure of claim 4, wherein the solder resist portion is one of a plurality of solder resist portions that are respectively located between pairs of adjacent lands of the second plurality of lands.

9. The structure of claim 4, wherein the solder resist portion is one of a plurality of solder resist portions that are respectively located between each adjacent pair of lands of the second plurality of lands.

10. The structure of claim 4, wherein the solder resist portion is one of a plurality of parallel solder resist portions that are respectively located between adjacent pairs of lands of the second plurality of lands.

* * * * *

UNITED STATES PATENT AND TRADEMARK OFFICE
CERTIFICATE OF CORRECTION

PATENT NO. : 6,966,482 B2  Page 1 of 1
APPLICATION NO. : 10/340798
DATED : November 22, 2005
INVENTOR(S) : Makoto Totani et al.

It is certified that error appears in the above-identified patent and that said Letters Patent is hereby corrected as shown below:

On The Title Page:

Correct the named inventors in item (75) to read as:

>Makoto Totani, Kariya (JP);
>Toshihiro Miyake, Inuyama (JP);
>Takehito Teramae, Chiryu (JP);
>Yoshitaro Yazaki, Anjo (JP);
>Kazuyuki Deguchi, Inabe-gun (JP);
>Hajime Nakagawa, Aichi-gun (JP)

Signed and Sealed this

Twenty-second Day of August, 2006

JON W. DUDAS
*Director of the United States Patent and Trademark Office*